US009937697B2

(12) United States Patent
Segal

(10) Patent No.: US 9,937,697 B2
(45) Date of Patent: Apr. 10, 2018

(54) SYSTEM AND METHOD FOR CONSTRUCTING 3D OBJECTS

(71) Applicant: Edo Segal, New York, NY (US)

(72) Inventor: Edo Segal, New York, NY (US)

(73) Assignee: Edo Segal, New York, NY (US)

( * ) Notice: Subject to any disclaimer, the term of this patent is extended or adjusted under 35 U.S.C. 154(b) by 0 days.

(21) Appl. No.: 14/657,726

(22) Filed: Mar. 13, 2015

(65) Prior Publication Data
US 2016/0129683 A1    May 12, 2016

Related U.S. Application Data

(63) Continuation of application No. 14/656,576, filed on Mar. 12, 2015.
(Continued)

(51) Int. Cl.
| | | |
|---|---|---|
| *B32B 41/00* | (2006.01) | |
| *B65D 25/52* | (2006.01) | |
| *G06F 17/50* | (2006.01) | |
| *B23P 19/04* | (2006.01) | |
| *B32B 37/00* | (2006.01) | |
| *B32B 37/12* | (2006.01) | |
| *B32B 37/18* | (2006.01) | |

(Continued)

(52) U.S. Cl.
CPC .............. *B32B 41/00* (2013.01); *B23P 19/04* (2013.01); *B25J 9/1687* (2013.01); *B29C 65/56* (2013.01); *B32B 37/0046* (2013.01); *B32B 37/12* (2013.01); *B32B 37/1207* (2013.01); *B32B 37/18* (2013.01); *B32B 38/0008* (2013.01); *B32B 38/18* (2013.01); *B32B 39/00* (2013.01); *B65D 25/52* (2013.01); *G06F 17/5004* (2013.01); *G06F 17/5086* (2013.01); *B29C 65/485* (2013.01); *B29C 65/4835* (2013.01); *B29C 65/58* (2013.01); *B32B 2037/1246* (2013.01); *G05B 19/4099* (2013.01); *G05B 2219/31044* (2013.01); *G05B 2219/40033* (2013.01); *Y02P 90/04* (2015.11); *Y02P 90/16* (2015.11); *Y02P 90/185* (2015.11)

(58) Field of Classification Search
CPC . B29C 67/0051; B29C 67/0092; B29C 65/02; B81C 2201/019
USPC .............. 156/58, 59, 64, 235, 249, 378, 379
See application file for complete search history.

(56) References Cited

U.S. PATENT DOCUMENTS

| | | | | |
|---|---|---|---|---|
| 3,809,186 A | * | 5/1974 | Suozzo | F16L 3/202 188/129 |
| 4,339,984 A | * | 7/1982 | Huhne | B25J 9/1025 192/146 |

(Continued)

*Primary Examiner* — Michael N Orlando
*Assistant Examiner* — Joshel Rivera
(74) *Attorney, Agent, or Firm* — Leason Ellis LLP

(57) ABSTRACT

The present invention is directed to an object construction device configured to enclose a specified assembly area and assemble objects, such as toys, using standardized interlocking assembly units. The construction device includes processor with a memory device configured to access an instruction set encoding the assembly instructions of the object. The processor executes the instruction set in order to control and direct an assembly unit manipulator to additively construct or assemble the object from the interlocking assembly units. The assembly units are configured with surface features that interconnect the assembly units such that once connected they are substantially permanently attached to one another.

16 Claims, 13 Drawing Sheets

Related U.S. Application Data

(60) Provisional application No. 62/076,224, filed on Nov. 6, 2014.

(51) Int. Cl.
| | | |
|---|---|---|
| *B32B 38/00* | (2006.01) | |
| *B32B 38/18* | (2006.01) | |
| *B32B 39/00* | (2006.01) | |
| *B25J 9/16* | (2006.01) | |
| *B29C 65/56* | (2006.01) | |
| *G05B 19/4099* | (2006.01) | |
| *B29C 65/48* | (2006.01) | |
| *B29C 65/58* | (2006.01) | |

(56) References Cited

U.S. PATENT DOCUMENTS

| | | |
|---|---|---|
| 5,686,180 A | 11/1997 | Rivlin et al. |
| 7,799,383 B2 | 9/2010 | Hachikian et al. |
| 2001/0042598 A1* | 11/2001 | Yamada ................ B81C 99/008 156/362 |
| 2006/0032582 A1* | 2/2006 | Chen ....................... H01L 24/83 156/272.6 |
| 2006/0054039 A1 | 3/2006 | Kritchman et al. |
| 2007/0006542 A1 | 1/2007 | Duke |
| 2008/0109103 A1 | 5/2008 | Gershenfeld et al. |
| 2010/0109247 A1 | 5/2010 | Cernansky et al. |
| 2011/0123794 A1 | 5/2011 | Hiller et al. |
| 2011/0239593 A1 | 10/2011 | Urban et al. |
| 2013/0189028 A1 | 7/2013 | Gershenfeld et al. |

* cited by examiner

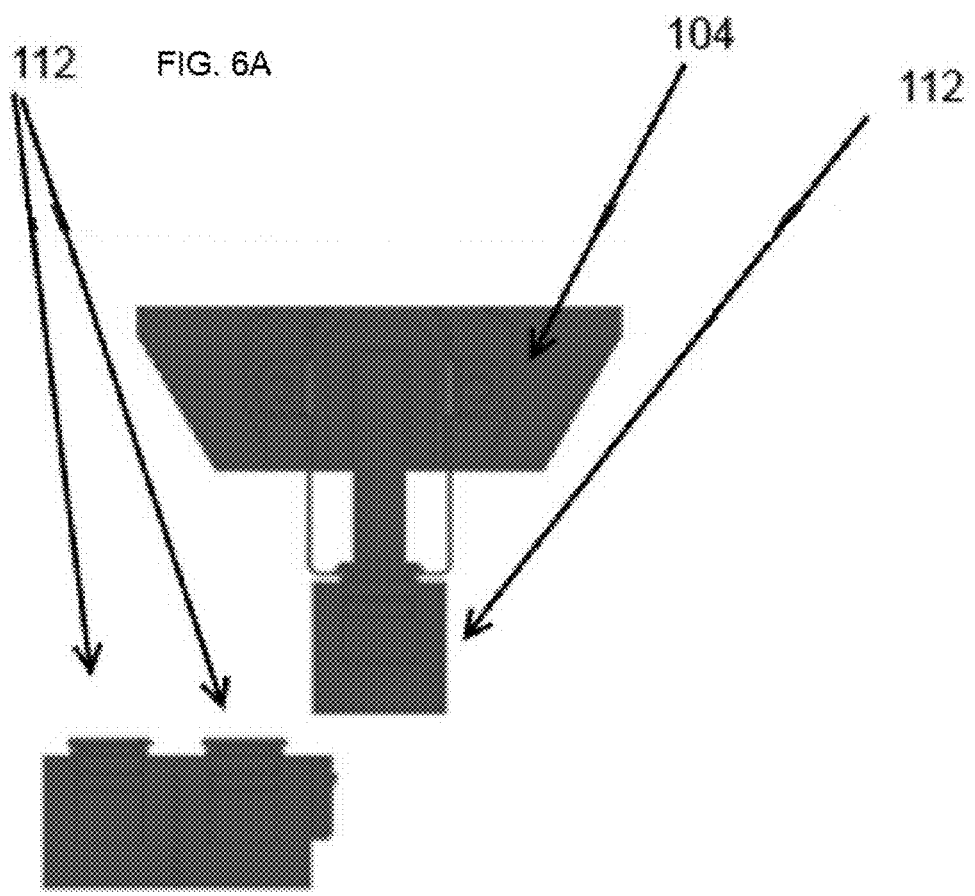

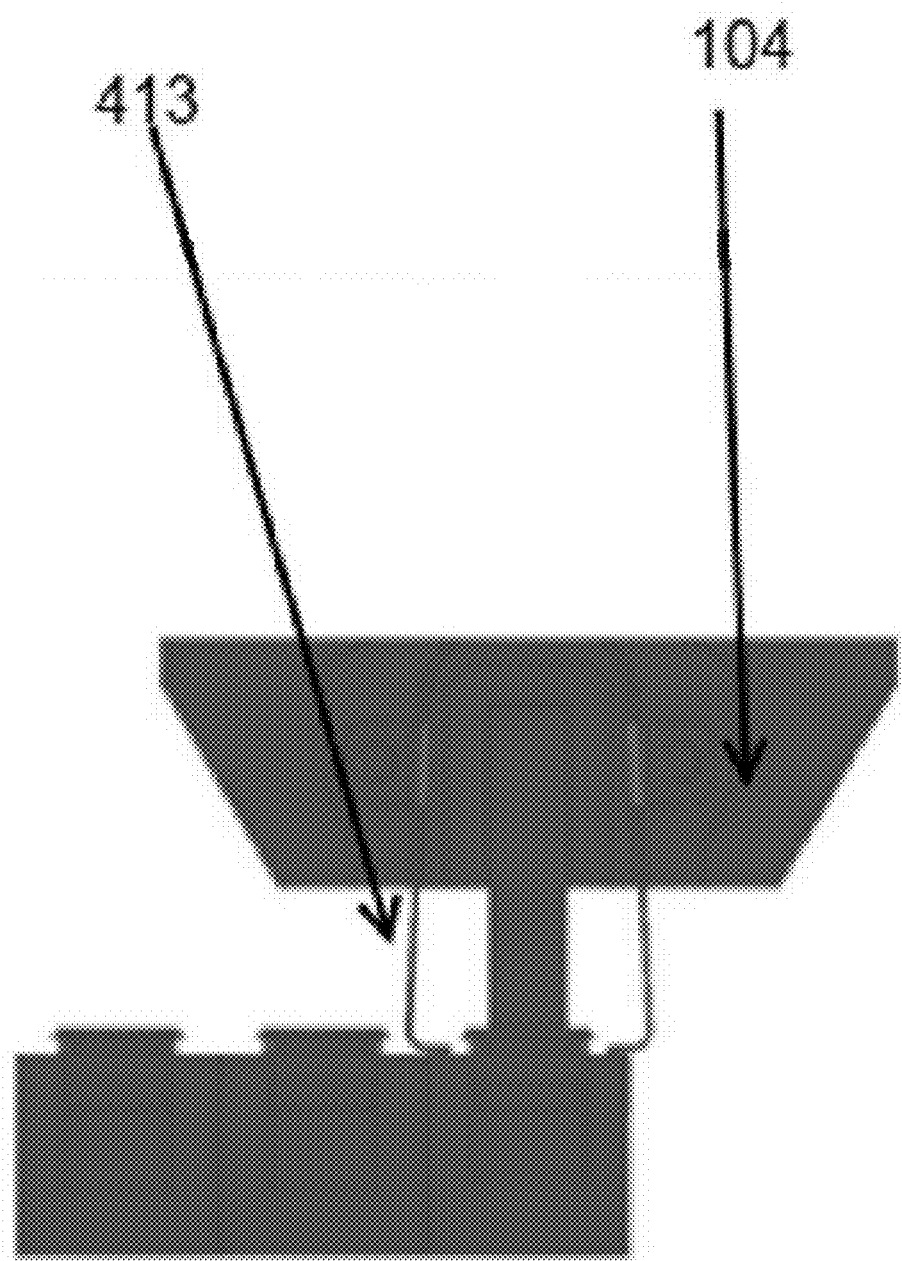

SYSTEM AND METHOD FOR CONSTRUCTING 3D OBJECTS

CROSS-REFERENCE TO RELATED PATENT APPLICATIONS

This is a Continuation Application of U.S. application Ser. No. 14/656,576, filed Mar. 12, 2015, and application claims the benefit of priority under 35 U.S.C. Section 119 of U.S. provisional patent application No. 61/951,945, filed on Mar. 12, 2014, entitled "A System and Method for Assembling Objects," and U.S. provisional patent application No. 62/076,224, filed on Nov. 6, 2014, entitled "A System and Method for Constructing 3D Objects," each of which is hereby incorporated by reference in its respective entirety.

FIELD OF THE INVENTION

The present invention is directed to an apparatus and method for constructing or 3D printing objects using standardized assembly units according to a specific instruction set. In one particular arrangement, the present invention describes an apparatus configured to assemble or construct an object from a supply of multi-colored assembly units according to an electronic instruction set included along with the supply of standard assembly units. In another arrangement, the invention is directed to constructing an object, such as a toy, from standard assembly units that are permanently bonded or affixed to one another. This permanent bonding characteristic is accomplished by mechanical or chemical adhesion mechanisms.

BACKGROUND OF THE INVENTION

Additive and subtractive manufacturing technologies enable computer designs, such as CAD files, to be made into three dimensional (3D) objects. 3D printing, also known as additive manufacturing, typically comprises depositing, curing, fusing, or otherwise forming a material into sequential cross-sectional layers of the 3D object.

For example, fused deposition modeling techniques, which are generally disclosed in U.S. Pat. No. 4,749,347 and U.S. Pat. No. 5,121,329, herein incorporated by reference, describe melting a filament of material and extruding the material out of a dispenser that is moved in the x, y and z-axes relative to a print pad. The material is generally deposited in layers in the x and y axes to form cross-sectional layers that are stacked along the z-axis to form the 3D object.

The prior art uses powders, resins and other substances to additively assemble structures.

However there is no description in the art for assembling objects using a plurality of uniform, discrete assembly units. Furthermore, the art does not describe uniform discrete assembly units having specific color characteristics. Thus, what is needed in the art is an apparatus and method for assembling objects having specific and varied color characteristics without the necessity for painting or otherwise adorning the object after assembly.

Additionally the construction devices and methods describe solve the problem of constructing structurally sound objects from standardized assembly units, especially standardized assembly units of uniform size.

SUMMARY OF THE INVENTION

In certain aspects, the present invention concerns an apparatus and method for assembling objects using standardized assembly units, or voxels. As used herein a "voxel" is a three dimensional assembly unit which operates as a 3-dimensional extension of a 2D pixel, i.e., a volume pixel.

In one particular arrangement, an object construction device is configured to enclose a specified assembly area and assemble objects, such as toys, within this assembly area. The construction device includes a processor with a memory device configured to access an instruction set encoding the assembly instructions of the object. The processor executes the instruction set in order to control and direct a voxel manipulator to additively construct or assemble the object from voxel construction units. The voxel manipulator is further configured to alter the orientation of at least one voxel prior to positioning the voxel in the assembly area. The voxels are stored prior to use in a storage device configured to supply voxels to the voxel manipulator. In one specific, yet non-limiting implementation, the voxels are arranged in the voxel storage device according to the order of use in the assembly process.

BRIEF DESCRIPTION OF THE DRAWINGS

The foregoing and other features of the arrangements of the present invention will be more readily apparent from the following detailed description and drawings of an illustrative embodiment of the invention.

FIG. 6A is a side cut-away view of a further operation of a voxel manipulator according to one arrangement of the present invention.

FIG. 6C is a side cut-away view of the continued operation of a voxel manipulator according to one arrangement of FIG. 6A.

DESCRIPTION OF CERTAIN EMBODIMENTS OF THE INVENTION

By way of overview and introduction, the present apparatus and method describe constructing objects out of a plurality of standardized construction units, herein "voxels", using an object constructor. In one particular arrangement, the apparatus is configured to assemble a three-dimensional object out of standardized construction units placed in overlapping and interlocking layers and having particular surface features and characteristics. For example, the object constructor constructs a three-dimensional article, such as a toy, having a variety of color features. By constructing the toy from voxels of varying colors, the end user avoids the necessity of painting the finished assembled object. Additionally, depending of the size and nature of the assembled object, the use of different colors allows for the integration of text and graphics onto the surface of the object at the time of assembly.

Figure 1:
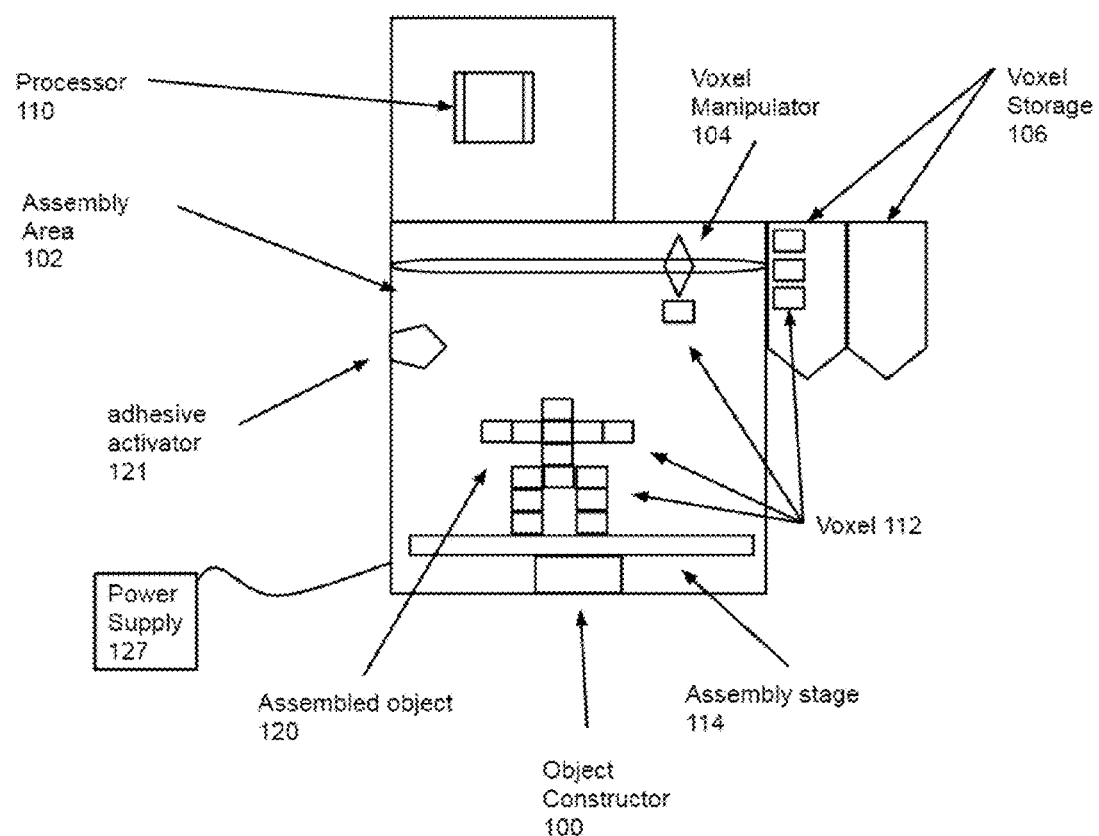
FIG. 1 is a cutaway view of an embodiment of the arrangement of the present invention depicting the object assembly apparatus.

As shown in FIG. 1, the object constructor 100 includes an object assembly area 102, a voxel manipulator 104, and a plurality of voxel storage containers 106. The object constructor 100 also includes a processor or computer 110 configured to instruct the voxel manipulator 104 where to position a voxel 112 within the object assembly area based on an instruction set. In one arrangement, the instruction set is a computer file, such as a CAD computer file.

In a particular configuration, the object construction device also includes a power supply 127. In one non limiting example, the power supply is battery supply. In an alternative configuration, the power supply is an AC/DC converter device to transform AC outlet power to DC power. Those possessing ordinary skill in the art will appreciate that the power supply operates in cooperation with the processor and power control or distribution linkages to deliver power to the various components.

As shown in the illustrated configuration, the assembly area 102 defines an enclosed space that includes an assembly stage 114. The assembly stage 114 is configured to be raised or lowered in order to meet the voxel manipulator 104. In one arrangement, the voxel manipulator 104 works in conjunction with the assembly stage 114 in order to move and position voxels 112 within the assembly area. In a particular configuration, the movement of the assembly stage 114 is controlled by instructions or signals sent from the processor 110, such as may be used to energize a motor or solenoid that has moveable parts physically coupled to the assembly stage.

The object constructor 100 constructs the intended object 120 using a plurality of voxel construction units 112. A voxel 112 is a three dimensional interlocking assembly unit, and as such, has at least one surface feature for mechanically attaching to a complimentary surface feature on at least one other voxel. In a further arrangement, the voxels are each provided with attachment features that allow the voxels to be permanently secured with vertically and horizontally aligned neighboring voxels. More particularly, the voxels allow for multi-voxel width and height objects to be constructed free of the need to use an overlapping, or brickwork like stacking strategy.

In the illustrated configurations, the voxel 112 is substantially square in two dimensions, and can be substantially cubic in all three dimensions. In alternative arrangements, the voxels 112 have different polyhedron configurations such as tetrahedral, hexahedral or other known and understood three-dimensional shapes. In yet a further arrangement, the voxel 112 is spherical or ovoid in shape.

In the illustrated arrangement, the object constructor 100 also includes an optional adhesive or binding activator 121. The adhesive activator is configured to activate an adhesive coated on the surface of the voxels. For example, where the voxel is coated in a heat activated adhesive the adhesive activator is a device configured to transmit electromagnetic energy to the voxel in the form of infrared light. Alternatively, the adhesive activator is used to deposit a water vapor onto a voxel coated with a water activated adhesive.

In one particular arrangement, the voxels have millimeter scale dimensions. In this configuration, the voxels are used to construct small scale items and objects. Thus, the overall dimensions of the voxels 112 are sufficiently small to allow efficient 3D manufacturing techniques In an alternative implementation, the voxels have diameters of at least 1 centimeter in size along one side or dimension of the voxel 112. Thus, unlike prior art additive and subtractive 3D manufacturing techniques, the invention described uses voxels having dimensions that allow for individual manipulation.

Those skilled in the art will also appreciate in at least one arrangement of the described apparatus and method, the voxels 112 used in assembling the object 120 are selected from a number of different shapes and sizes.

As illustrated in FIGS. 1 and 2A-C, the voxels 112 are stored in a voxel storage device 106. In a particular iteration of the object assembly apparatus, the voxel storage device 106 is a cartridge 504. In the illustrated configuration, two voxel storage devices are provided. Those skilled in the art will appreciate that any number of voxel cartridges can be used in suitable arrangement with the device and methods described.

Figure 2:
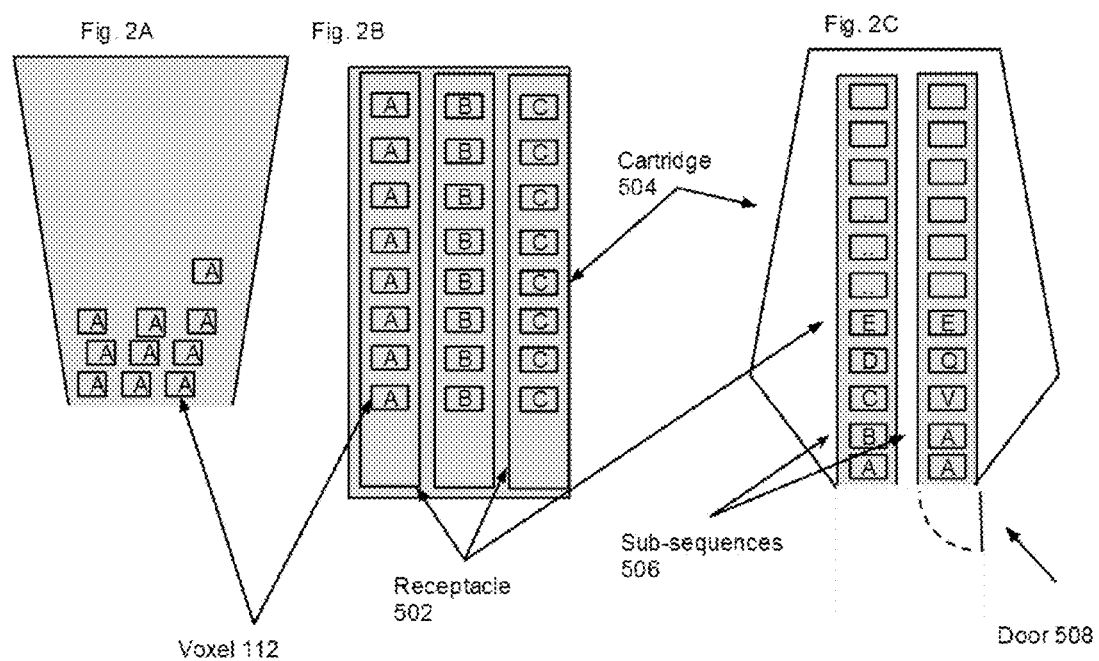
FIG. 2A is a side cut-away view of one embodiment of the cartridge of the present invention one arrangement of the present invention.
FIG. 2B is a side cut-away view of a different embodiment of the cartridge of the present invention.
FIG. 2C is a side cut-away view of a further embodiment of the cartridge of the present invention.
FIG. 2D is a side cut-away view of an alternative embodiment of the cartridge of the present invention.

In a non-limiting arrangement of the elements described in FIG. 2A, the voxel storage 106 is composed of a cartridge containing an unordered collection of voxels 112. In this particular arrangement, voxels 112 in a given cartridge have identical characteristics, such as identical shape and color.

In an alternative arrangement shown in FIG. 2B, the voxel cartridge is composed of a plurality of receptacles 502, each receptacle holding voxels of different characteristics. For example, one storage receptacle 502 is equipped with a collection of voxels each having a particular color, dimension or combination of features. In this arrangement, the number of voxels in each sub-arrangement or collection is not tied to the specific construction instructions for a given item or object.

In still a further arrangement, as illustrated in FIG. 2C, the cartridge 504 contains a pre-determined number of voxels that exit from the cartridge in a pre-determined sequence (A, B, C, D, E . . . ). This sequence is related to the instruction steps necessary to construct the object 120. For example, the voxels 112 stored in the cartridge 504 are arranged such that the first voxel accessible to the voxel feed represents the first voxel necessary to assemble a particular object 120. Depending on the nature and complexity of the object 120 under assembly, an array of sub-sequences 506 is provided. Each subsequence contains a specific sub sequence that corresponds to a portion of the overall object assembly sequence.

These cartridge types can be used as a standalone cartridge or in various combinations with other cartridge types. By way of non-limiting example, the object constructor is equipped with a plurality of cartridges, each cartridge holding a plurality of receptacles containing voxels having different characteristics.

In a particular arrangement, the cartridges are equipped with an exit port or door 508 configured to allow the voxels to leave the cartridge or receptacle. Those skilled in the art will appreciate that the door 508 is activated by commonly used mechanisms, such as springs, levers, louvers, dilators, and the like. The voxels are configured to exit the cartridge for use in the construction process. In one non-limiting arrangement, each cartridge is equipped with a mechanical door or port configured to allow passage of one voxel at a time from the cartridge to the voxel manipulator.

For example, the door 508 is spring operated and configured to work with the force of gravity to remove voxels from the bottom of the cartridge. In an alternative configuration, the cartridge and/or sub cartridges are equipped with spring-loaded pushing mechanisms configured to push voxels out of the cartridge according to an electrical or mechanical input. In a further arrangement, the cartridge is equipped with a sliding element, that when retracted, allows the removal of a voxel. In this arrangement the object constructor is equipped with sufficient extraction devices to obtain a voxel from the cartridge and orient the voxel into proper placement position.

Figure 2D:
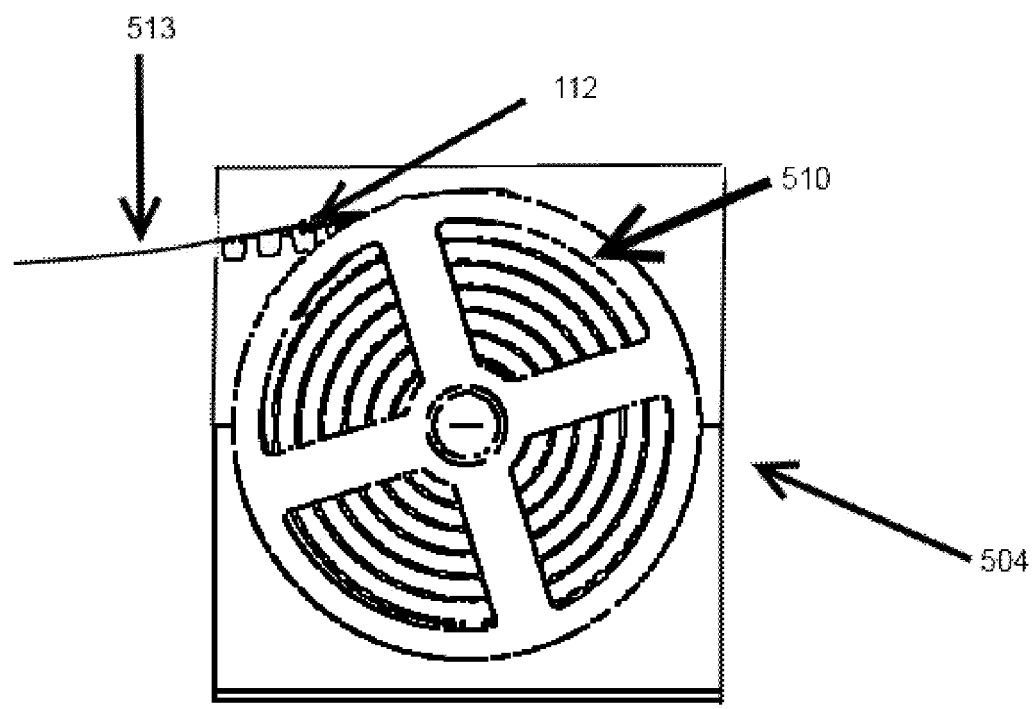
Figure 3:
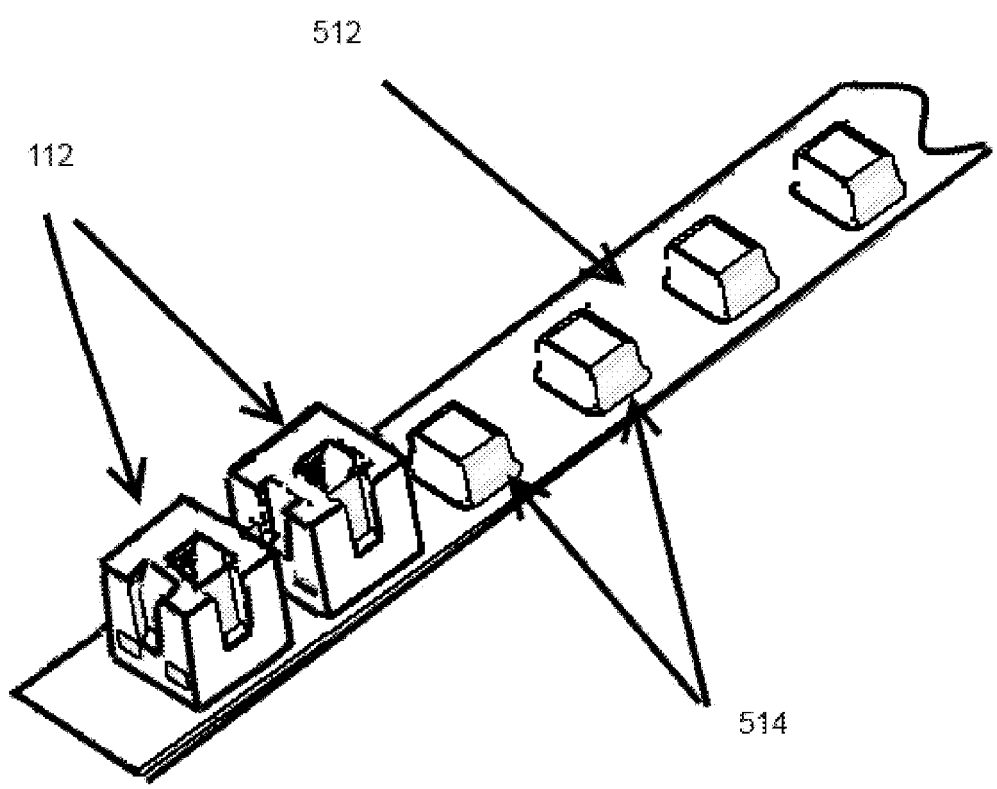
FIG. 3 is a side view of the construction units' backing strip according to one arrangement of the present invention.

An alternative arrangement of the voxel cartridge is provided in FIG. 2D, a portion of which is shown in detail in FIG. 3. Here, the voxels are secured on a strip 512 wound upon a spool 510 in a cartridge 504. By activating an advance mechanism controlled by the processor 110, the strip of voxels 512 is advanced so as to present voxels 112 to the voxel manipulator 104. In an alternative configuration, a mechanism for advancing the voxels within the cartridge is contained within the cartridge and is controlled by the processor via electrical linkages. In yet a further arrangement, the advancing mechanism is manually controlled and operable. In a further arrangement, a second spool is provided as a take-up wheel to store an empty backing strip and provide tension to the strip 504.

As illustrated, the voxels 112 are arranged on the bottom portion of the strip 512. However, in an alternative configuration, the voxels are placed on a top surface of the strip. One potential configuration of the backing strip is provided in FIG. 3. As shown, the voxels 112 are attached to a backing or strip material 512 by securing the voxel to a strip retainer 514. The strip retainer 514 is configured to removably couple to one of the interlocking elements of the voxel 112 and secure the voxel to the strip.

In an additional or alternative configuration, the voxels are pushed out of or otherwise extracted from the cartridge. In one or more configurations, the cartridge is equipped with an extraction device, such as a plunger or other mechanical device configured to push voxels out of the cartridge. In a further arrangement the voxel pushing device is controlled electronically. In still a further configuration, the voxel pushing device is a mechanically operated device.

In a further arrangement, the described cartridges 504 are equipped with an additional data storage element, or a separate processor (not shown). The data element 110 of the object constructor 100 is configured to receive the instruction set from the data storage element of the cartridge 504. A processor integral to the cartridge 504 is configured to communicate with the processor 110 in order to transmit the instruction set based on the data stored in the data storage element included with the cartridge 504. The stored data or instruction set included with the cartridge optionally includes a template for the construction of an object 102 using the pre-determined voxels 112 in the cartridge 504.

In one configuration of the object construction apparatus, the data stored in the data storage element of the cartridge 504 also includes authentication and use data. The authentication data is used to confirm that the cartridge 504 is used in conjunction with a verified object constructor 100. In a specific configuration, the use data confirms an authorized amount of times that the instruction set can be used to assemble a given object 102. The use code configures the object constructor 100 to assemble a single object 120 based on the instruction set stored within the data storage device of the cartridge 504. Alternatively, the use code grants unlimited access to the instruction set regardless of the amount of voxels present in the cartridge.

The voxels 112 are moved from the voxel storage 106 by way of the voxel manipulator 104. In one arrangement, the cartridge includes a strip or portion of backing material.

Figure 4:
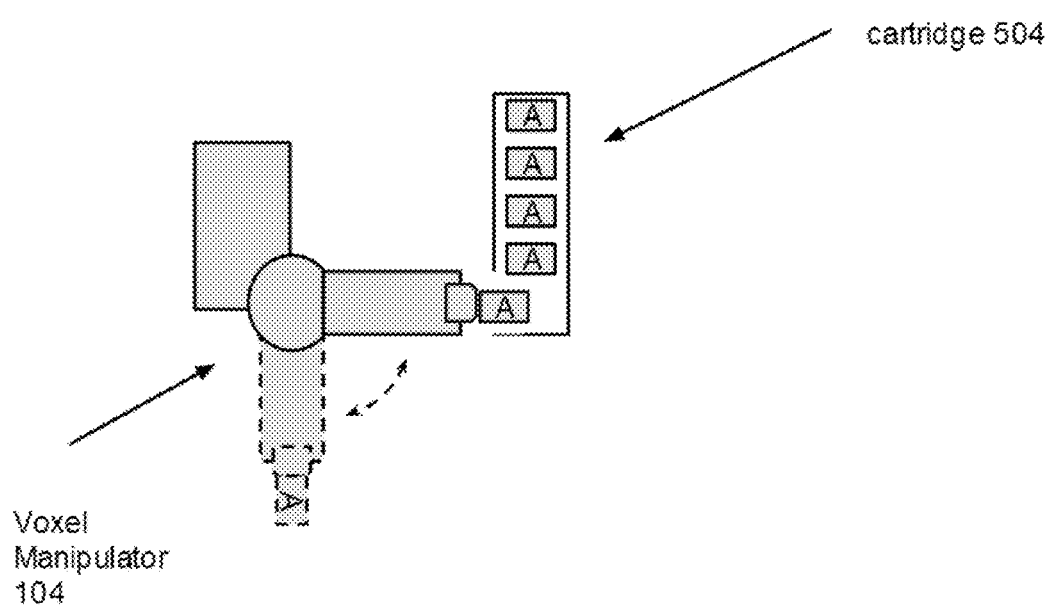
FIG. 4 is a side cutaway view of the further elements in one arrangement of the present invention.

In a further, non-limiting arrangement shown in FIG. 4, the voxel manipulator is used to obtain the voxels from the voxel storage devices directly. For instance, in one arrangement the voxel manipulator 104 is configured to access or receive a voxel 112 that has exited from a receptacle or cartridge 504. In an alternative arrangement, the voxel manipulator is configured to extract the voxel 112 from the cartridge directly and orient the voxel for placement and use in the construction process. In a further configuration, the voxel manipulator 104 is configured to alter the orientation of each voxel 112 that is received from the voxel feed, such that a desired surface of the voxel 112 is placed in a proper location.

Figure 5:
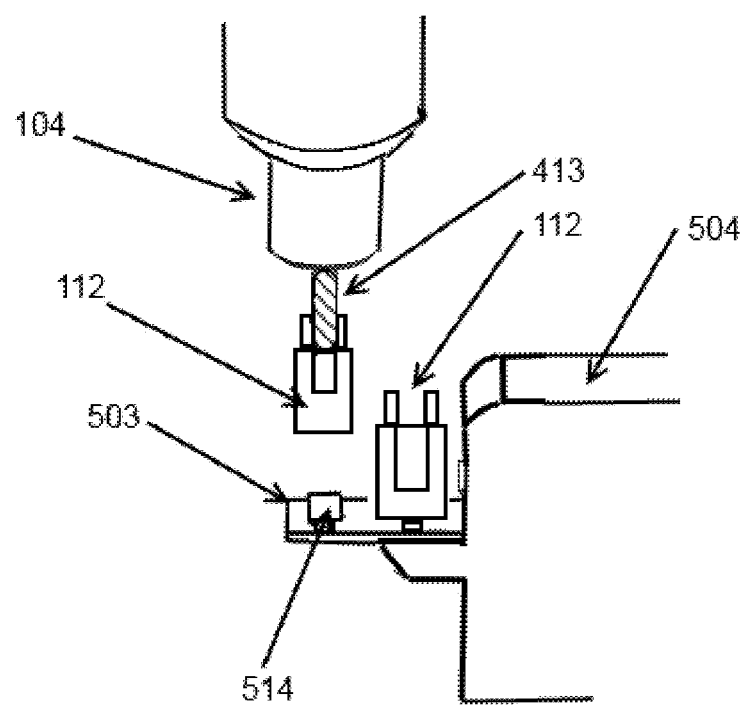
FIG. 5 is a diagram of the operation of a voxel manipulator according to one arrangement of the present invention.

In one arrangement shown in FIG. 5, the voxel manipulator 104 is configured to select a voxel using the voxel capture head 413 and move the voxel 112 by selecting a transporting it to the desired location within the X, Y coordinate space. Specifically, the voxel manipulator is configured to move in the X, Y and Z coordinate space to allow for the selection and transport of voxels. In the arrangement of FIG. 5, the voxel capture head couples to an interlocking element of the voxel 112 and extracts the voxel 112 from the backing strip material 512.

In a particular configuration shown in FIG. 6, the voxel capture head 413 is provided with an end piece having a given shape. Likewise, the voxels in this arrangement are provided with an opening on the top portion having a complementary shape to the end piece, the voxel manipulator descends and inserts the end piece into the complementary opening and then rotates the end piece such that the end piece shape and the voxel opening are no longer complementary. The voxel manipulator raises the voxel capture head and removes the voxel from the its backing strip.

As illustrated in FIG. 6, the voxel manipulator 104 is configured to select a portion of the voxel 112 with voxel capture head 413, and use the capture head to secure a voxel 112 for transport to the desired location.

Figure 6B:
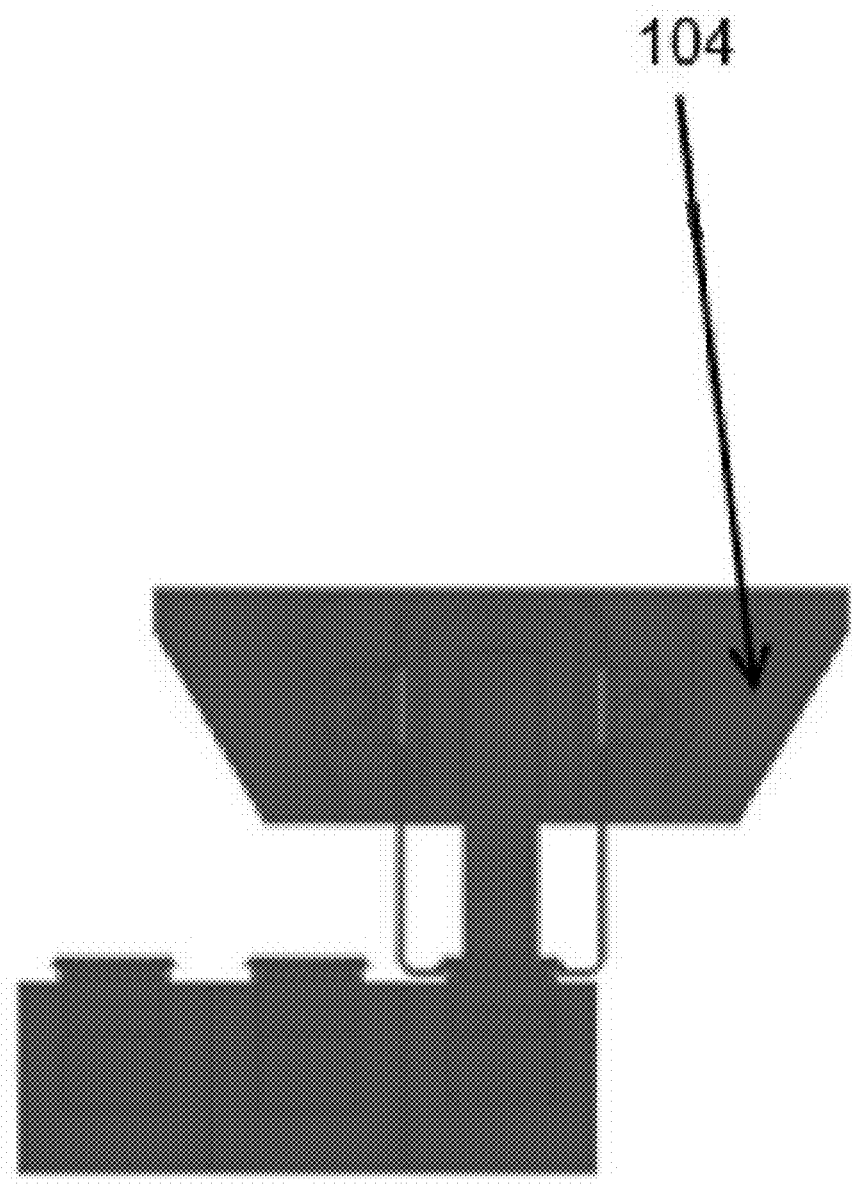
FIG. 6B is a side cut-away view of the continued operation of a voxel manipulator according to one arrangement of FIG. 6A.
Figure 6D:
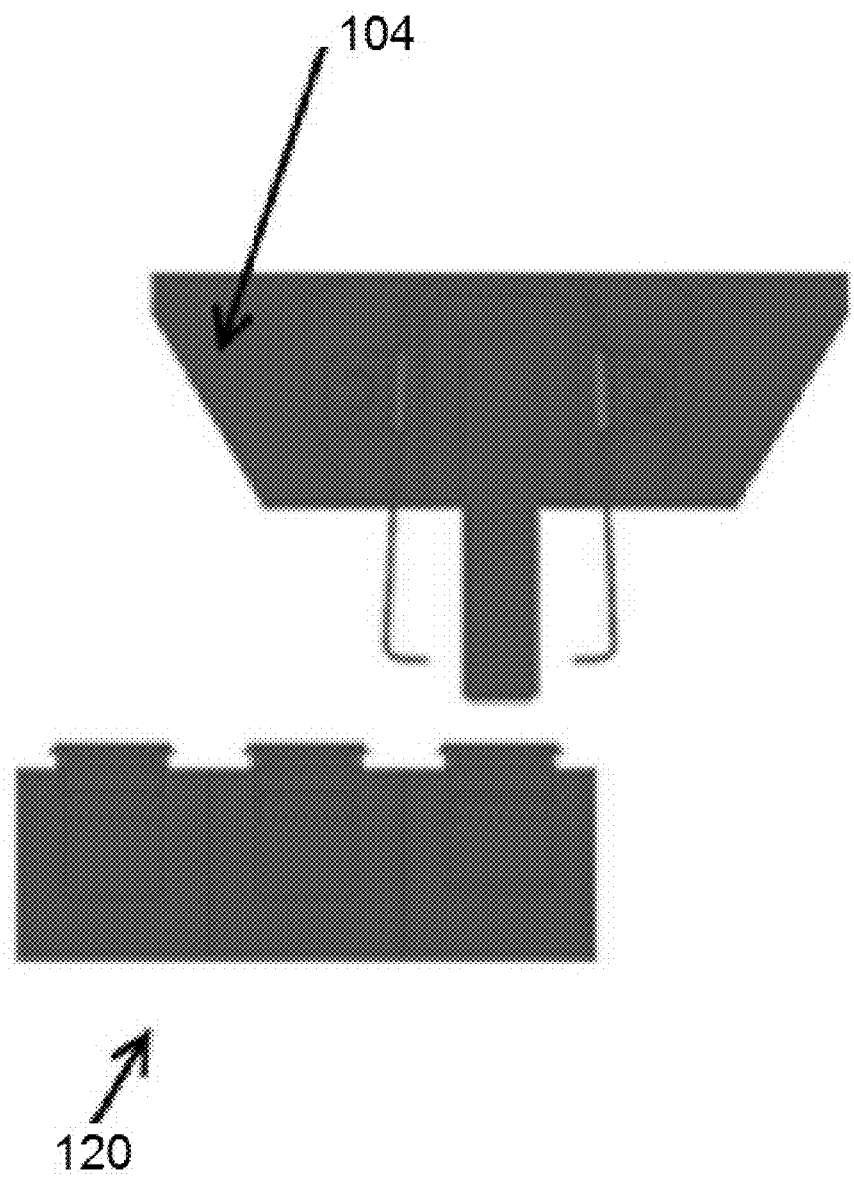
FIG. 6D is a side cut-away view of the continued operation of a voxel manipulator according to one arrangement of FIG. 6A.

The processor 110 is configured to instruct the voxel manipulator 104 to deliver the voxel to a given location within an X and Y and optionally Z axis coordinate space within the assembly area 102. Continuing with the voxel positioning illustrated in FIG. 5, FIGS. 6A-D illustrates the placement of a voxel in the course of assembling the object 120. As shown, a voxel 112 is positioned in proximity to an object 120 already under construction. As shown, a voxel 112 is then moved to a position, as in FIG. 6B that allows it to join or bind to another voxel that is already part of the object 120 under construction. As shown in FIGS. 6C-D, the voxel manipulator releases the voxels and moves to retrieve another voxel.

Figure 7:
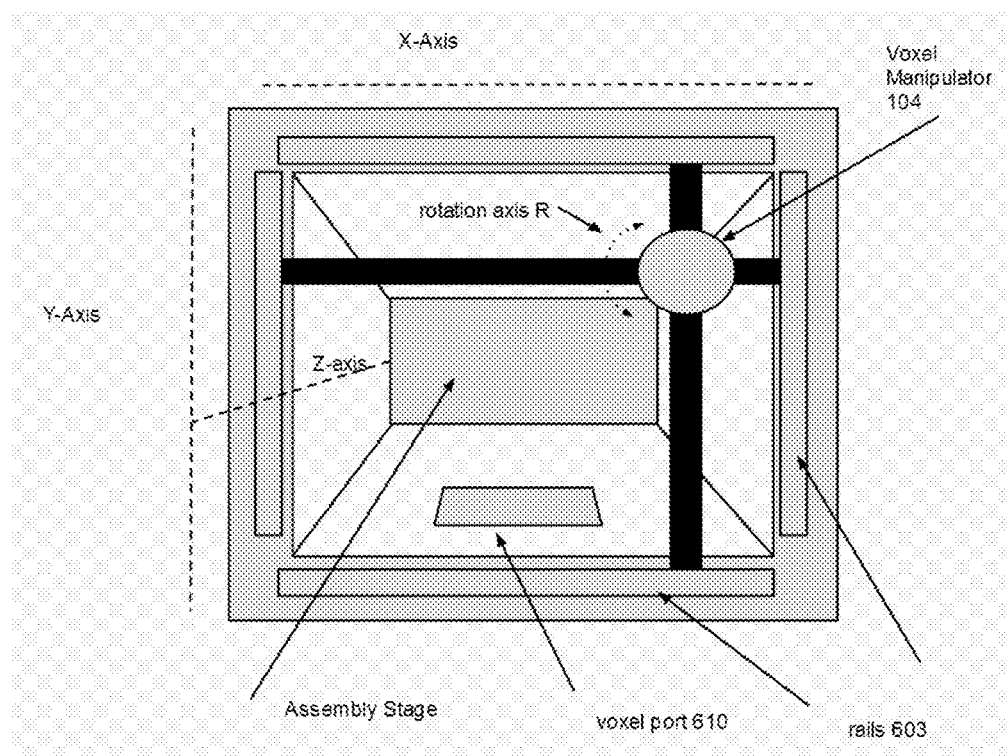
FIG. 7 is a top-down view of a further particular arrangement of the present invention.

As shown in FIG. 7, the entire voxel manipulator 104 assembly is configured to move vertically along the Z-axis within the assembly area to deliver a voxel 112 to a given location. In this arrangement, the voxel manipulator 104 is equipped with motors, gears, solenoids or other actuators to allow for vertical movement of the voxel capture head 413, such that the voxel capture head 413 is positioned over the voxel and moved to retrieve a voxel 112 from a voxel storage container. In a particular arrangement, the voxel manipulator 104 is configured to move along rails 603 aligned along the perimeter of the assembly area 102 using a motor or arrangement of motors. In this configuration, the voxels are deposited in the assembly area in a layer-by-layer manner in order to assemble the particular three-dimensional object.

In a further configuration, the voxel manipulator 104 is configured to move within the x-y space of the assembly area in movement increments corresponding to the dimensions of a single voxel. For example, the voxel manipulator 104 is equipped with a drive system. The drive system is configured to deliver energy to the motor in pulses, each pulse configured to only advance the motor, such that the voxel manipulator 104 has moved the width of a voxel 112. In an alternative configuration, the voxel manipulator 104 is equipped with a gear arrangement that limits the movement of the voxel manipulator to voxel length movement increments.

In a further arrangement, the voxel manipulator 104 or processor 110 is configured with sensing and feedback mechanisms. For example, the voxel manipulator 104 includes a mechanical or electronic device (not shown) configured to count the number of movement steps intended by the processor instruction set and compare that information to the present location of the voxel manipulator 104. In one arrangement a two-dimensional gird is used to orient the present position of the voxel manipulator 104. Any of the foregoing mechanisms are then used to correct the position of the voxel manipulator 104 such that a voxel is positioned correctly.

In one particular arrangement, the voxel manipulator 104 is configured to change the orientation of the voxel 112 such that a particular surface is presented as an exterior surface of the object 120. In one arrangement the voxel manipulator 104 is configured to rotate along rotation axis R in order to alter the orientation of the voxel 112. The voxel manipulator 104 receives the voxels 112 from the voxel feed 108 at a voxel head (not shown). In a particular arrangement the voxels 112 are held in place prior to positioning by the voxel head by friction, surface tension, magnetic fields or compressive pressure.

Once the voxel 112 has been placed in the location determined by the instruction set executed by the processor 110, subsequent voxels 112 are obtained from voxel storage 106 and are placed according to the instruction set. In another implementation, subsequent voxels 112 can be obtained from voxel storage 106 while another voxel is being placed relative to the assembly stage 114.

In order to place the voxels, a computer or processor 110 is utilized to execute instructions detailing the acquisition of voxels according to a pre-set or user defined plan or schematic. In one configuration, the processor is configured to access pre-set instructions stored in an onboard memory. In one implementation, the processor is a chipset of microchips that include separate and multiple analog and digital processors. As shown in FIG. 10, the processor can provide coordination of the other components of a general computing device, such as control of user interfaces, applications run by the computing device 1350, and data communication by the computing device.

Furthermore, the object constructor device of the present invention is configured to communicate with a general purpose computer equipped with software to control the functions of the object construction. In one arrangement the object constructor is connected to a general purpose computer by a physical linkage, such as, but not limited to, a USB cable. Alternatively, the object constructor is equipped with wireless communication protocols features that permit the bi-directional or unidirectional exchange of data from the general computer to the object constructor.

In still a further arrangement, the general computer device is a portable or handled computing device such as, but not limited to, an Apple IOS®, Windows® or Android® operating system based device.

In a particular arrangement the processor 110 is equipped with a memory element that stores information for use with the processor device. In some implementations, the memory is a volatile memory unit or units. In alternative implementations, the memory is a non-volatile memory unit or units. Alternatively, the memory includes magnetic or optical disk(s) or solid state memory components.

In one non-limiting arrangement, the general computer is equipped with software for designing an object to be constructed and converting that design into instructions for use by the object constructor. In an alternative arrangement, the general purpose computer is configured to access a software appliance located on a remote server configured to store and provide access to instructions sets that have been purchased and/or created.

The present invention also includes a method of using the object assembly device described to carry out and achieve the function of building an object using supplied voxels 112 according to an instruction set supplied to the processor. The instruction step includes receiving an instruction set indicating the necessary steps required for assembling a specified object 120 from voxel 112 units.

In one arrangement the steps include an accessing step for accessing an instruction set from a cartridge in communicative contact with the object constructor. In the alternative, the accessing step includes accessing an instruction set from a remote storage device or computer.

The method also includes a voxel acquisition step for instructing the voxel feed to transport voxels to the voxel manipulator for placement in the assembly area. In one arrangement the voxel acquisition step includes selecting the appropriate voxel from a plurality of voxel reservoirs or cartridge sub-arrays. The method described also includes an optional voxel reservoir selection step where voxels having a specific characteristic are selected from a specific voxel reservoir.

The method further includes a voxel placement step in which the voxel manipulator transports a voxel to a location according to the instructions provided in the instruction set. In one arrangement, the voxel placement step includes sending instructions to the assembly stage to rise vertically to a given height so as to provide the proper placement position for the voxel. In an alternative arrangement the voxel placement step includes moving the voxel manipulator along 3-axis so as to place the voxel at a given location on the assembly stage. In a further arrangement, the voxel placement step also includes a sub-step of aligning the voxel with another already placed voxel through the use of the voxel alignment element. Furthermore an additional step includes the manipulation of the orientation of a selected voxel by the voxel manipulator such that the appropriate color surface is selected.

The voxel manipulation and voxel acquisition steps are repeated continuously until the object detailed in the instruction set is assembled.

The method also includes an optional adhesion step, in which the voxels are bonded or otherwise permanently joined to one another. Depending on the nature of the voxel and the included adhesion properties, i.e. mechanical, electrostatic etc., the adhesion step includes bringing the voxels into contact with one another and activating the surface adhesion coatings. In one arrangement the adhesion step involves removing the assembled object from the object assembly area and exposing it to electromagnetic radiation, such as microwaves.

The steps described above and each of their processing functions can be operated as a series of programmed steps performed by a computer system having a processor or processors configured using one or more modules of computer-executable code. For instance, a set of software modules can be configured to cooperate with one another to configure a processor so that when executed, they provide an instruction set to an object constructor in order to assemble the intended object. In this regard, there can be a plurality of object selection modules, a voxel selection module, a manipulation module, and an adhesion module.

The instruction module can be configured as a series of discrete sub-modules designed to access an object creation instruction set from a data storage location and configure the computer to instruct the voxel manipulator to as to the proper placement of the voxels within the assembly area.

A voxel selection module can be configured as a series of discrete sub-modules designed to access the object creation instruction set and correlate that data to the specific voxels available in the voxel storage receptacle. For example, the voxel selection module can be configured to determine which voxel reservoir to select the necessary voxels given the intended color and shape of the intended object.

A voxel manipulation module can be configured as a series of discrete sub-modules designed to compare the instruction set for the intended object to the current state of the object, and position the next voxel accordingly.

An adhesion module is provided in which an adhesion device, accessible by the processor, is instructed to emit an adhesion substance, or energy that cures an adhesion substance for a specified period of time. For instance, the instruction can energize an emitter that opens a valve to release a substance under pressure in the direction of the voxels to be adhered. Likewise, the instruction can commence an action that otherwise causes an adhesive, vapor, or energy to be directed toward specific or general voxels in a prescribed manner.

Each of these modules can comprise hardware, code executing in a processor, or both, that configures a machine, such as the computing system, to implement the functionality described herein. The functionality of these modules can be combined or further separated, as understood by persons of ordinary skill in the art, in analogous implementations of arrangements of the invention.

The processor of the described apparatus is configurable for connection to remote storage devices and computing devices. For example the processor of the described apparatus is configuration for communication with a mobile computing device, or connecting via the internet to a remote server.

Figure 8A:
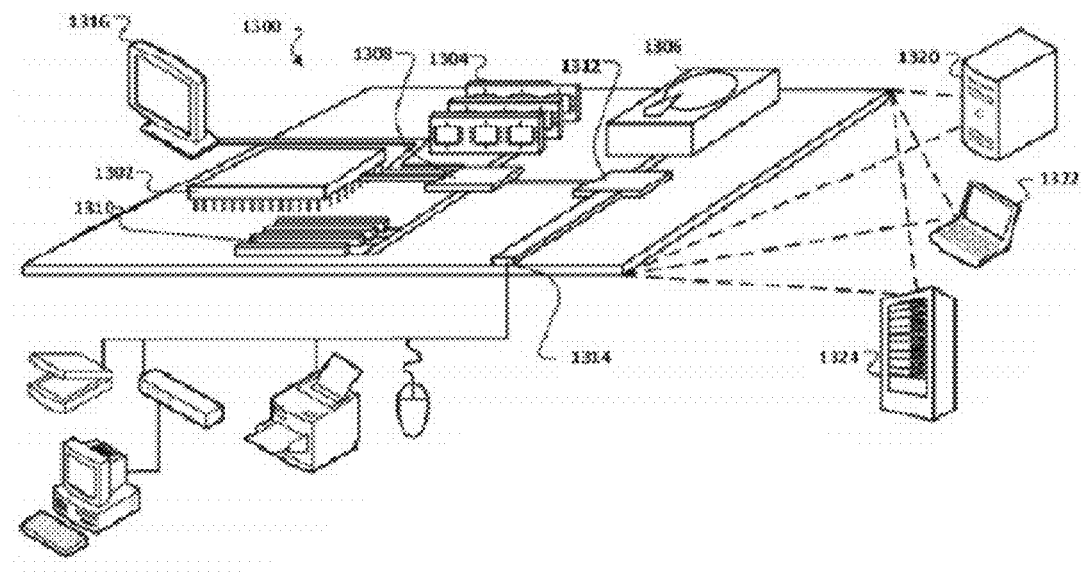
FIG. 8A is an illustrated diagram of the elements of the system of an embodiment of the present invention.

The computing system is further illustrated in FIG. 8A, and includes a processor 1302, a memory 1304, a storage device 1306, a high-speed interface 1308 connecting to the memory 1304 and multiple high-speed expansion ports 1310, and a low-speed interface 1312 connecting to a low-speed expansion port 1314 and the storage device 1306. Each of the processor 1302, the memory 1304, the storage device 1306, the high-speed interface 1308, the high-speed expansion ports 1310, and the low-speed interface 1312, are interconnected using various busses, and can be mounted on a common motherboard or in other manners as appropriate. The processor 1302 can process instructions for execution within the computing device 1300, including instructions stored in the memory 1304 or on the storage device 1306 to display graphical information for a GUI on an external input/output device, such as a display 1316 coupled to the high-speed interface 1308. In other implementations, multiple processors and/or multiple buses can be used, as appropriate, along with multiple memories and types of memory. Also, multiple computing devices can be connected, with each device providing portions of the necessary operations (e.g., as a server bank, a group of blade servers, or a multi-processor system).

Figure 8B:
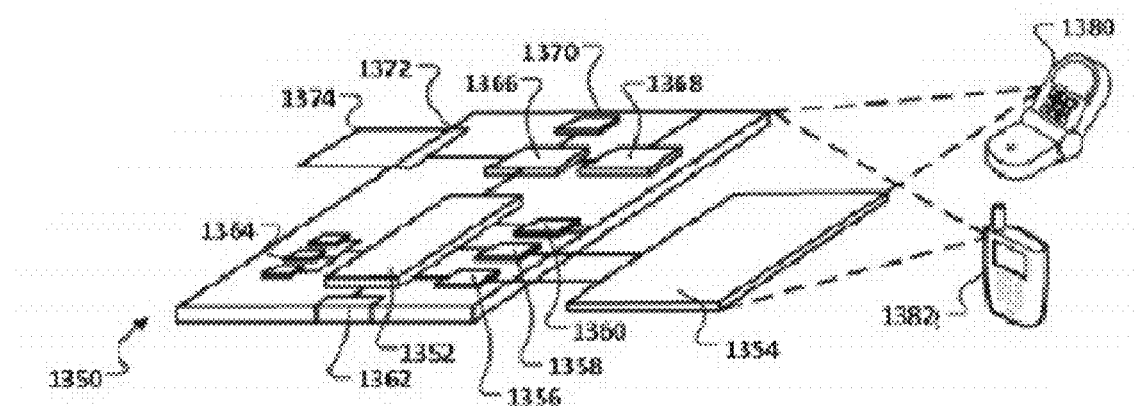
FIG. 8B is an illustrated diagram of further elements of the system of an embodiment of the present invention.

As further illustrated in FIG. 8B, the mobile computing device 1350 includes a processor 1352, a memory 1364, and an input/output device such as a display 1354, a communication interface 1366, and a transceiver 1368, among other components. The mobile computing device 1350 can also be provided with a storage device, such as a micro-drive or other device, to provide additional storage. Each of the processor 1352, the memory 1364, the display 1354, the communication interface 1366, and the transceiver 1368, are interconnected using various buses, and several of the components can be mounted on a common motherboard or in other manners as appropriate.

The processor 1352 can communicate with a user through a control interface 1358 and a display interface 1356 coupled to the display 1354. The display 1354 can be, for example, a TFT (Thin-Film-Transistor Liquid Crystal Display) display or an OLED (Organic Light Emitting Diode) display, or other appropriate display technology. The display interface 1356 can comprise appropriate circuitry for driving the display 1354 to present graphical and other information to a user. The control interface 1358 can receive commands from a user and convert them for submission to the processor 1352. In addition, an external interface 1362 can provide communication with the processor 1352, so as to enable near area communication of the mobile computing device 1350 with other devices. The external interface 1362 can provide, for example, for wired communication in some implementations, or for wireless communication in other implementations, and multiple interfaces can also be used.

The memory 1364 stores information within the mobile computing device 1350. The memory 1364 can be implemented as one or more of a computer-readable medium or media, a volatile memory unit or units, or a non-volatile memory unit or units. An expansion memory 1374 can also be provided and connected to the mobile computing device 1350 through an expansion interface 1372, which can include, for example, a SIMM (Single In Line Memory Module) card interface. The expansion memory 1374 can provide extra storage space for the mobile computing device 1350, or can also store applications or other information for the mobile computing device 1350. Specifically, the expansion memory 1374 can include instructions to carry out or supplement the processes described above, and can include secure information also. Thus, for example, the expansion memory 1374 can be provided as a security module for the mobile computing device 1350, and can be programmed with instructions that permit secure use of the mobile computing device 1350. In addition, secure applications can be provided via the SIMM cards, along with additional information, such as placing identifying information on the SIMM card in a non-hackable manner.

It should be understood that various combination, alternatives and modifications of the present invention could be devised by those skilled in the art. The present invention is intended to embrace all such alternatives, modifications and variances that fall within the scope of the appended claims.

While the invention has been particularly shown and described with reference to a preferred arrangement thereof, it will be understood by those skilled in the art that various changes in form and details may be made therein without departing from the spirit and scope of the invention The mobile computing device 1350 can communicate wirelessly through the communication interface 1366, which can include digital signal processing circuitry where necessary. The communication interface 1366 can provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), among others. Such communication can occur, for example, through the transceiver 1368 using a radio-frequency. In addition, short-range communication can occur, such as using a Bluetooth, WiFi, or other such transceiver (not shown). In addition, a GPS (Global Positioning System) receiver module 1370 can provide additional navigation- and location-related wireless data to the mobile computing device 1350, which can be used as appropriate by applications running on the mobile computing device 1350.

The mobile computing device 1350 can also communicate audibly using an audio codec 1360, which can receive spoken information from a user and convert it to usable digital information. The audio codec 1360 can likewise generate audible sound for a user, such as through a speaker, e.g., in a handset of the mobile computing device 1350. Such sound can include sound from voice telephone calls, can include recorded sound (e.g., voice messages, music files, etc.) and can also include sound generated by applications operating on the mobile computing device 1350.

The mobile computing device 1350 can be implemented in a number of different forms, as shown in the figure. For example, it can be implemented as a cellular telephone 1380. It can also be implemented as part of a smart-phone 1382, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable storage medium and computer-readable storage medium refer to any computer program product, apparatus and/or device (e.g., magnetic discs, optical disks, memory, Programmable Logic Devices (PLDs)) used to provide machine instructions and/or data to a programmable processor, including a machine-readable storage medium that receives machine instructions as a machine-readable signal. The term machine-readable signal refers to any signal used to provide machine instructions and/or data to a programmable processor. A machine-readable storage medium does not include a machine-readable signal.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any implementation or of what can be claimed, but rather as descriptions of features that can be specific to particular embodiments of particular implementations. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

It should be noted that use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing can be advantageous.

What is claimed:

1. An apparatus for assembling an object with at least one assembly unit, the assembly apparatus includes,
   an object assembly area;
   an assembly unit manipulator configured with a drive motor and an arrestor, the drive motor configured to move the assembly unit manipulator about the object assembly area in response to an electrical signal, the electrical signal configured to cause the drive motor to advance the assembly unit manipulator at least an increment of L, and the arrestor configured to limit the movement of the assembly unit manipulator to increments of L for each electrical signal received by the drive motor;
   a processor with a memory device configured to access an instruction set encoding the assembly of the object out of at least one assembly unit and control the assembly unit manipulator,
   the at least one assembly unit having a plurality of surfaces including at least one of dimension L, at least one surface configured with an interlocking attachment mechanism for irreversibly mechanically attaching the assembly unit to at least one other assembly unit;
   at least one assembly unit storage device configured to supply at least one assembly unit to the assembly unit manipulator; and
   the assembly unit manipulator further configured to transport the assembly unit from the storage device to a location within an the assembly area and irreversibly mechanically couple the assembly unit with at least one other assembly unit.

2. The object assembly device according to claim 1, wherein the assembly unit manipulator is configured to move the assembly unit within three dimensions in the object assembly area.

3. The object assembly device according to claim 1, wherein the object assembly area includes an assembly stage configured to move vertically within the object assembly area.

4. The object assembly device according to claim 1, wherein the assembly unit manipulator is configured to alter an orientation of at least one assembly unit to present a selected surface at a given location within the object assembly area.

5. The object assembly device according to claim 1, wherein the arrestor is configured to permit a shaft of the drive motor to rotate after the drive motor has received a subsequent electrical signal.

6. The object assembly device according to claim 1, wherein at least one surface of the assembly unit is equipped with an alignment mechanism configured to align the assembly unit with at least one other assembly unit.

7. The object assembly device according to claim 1, wherein the assembly unit is coated with an activated adhesive.

8. The object assembly device according to claim 7, further comprising an adhesive activator configured to activate the surface adhesive.

9. The object assembly device according to claim 8, wherein the adhesive activator is configured to dispense water vapor onto at least one surface of the assembly unit.

10. The object assembly device according to claim 8, wherein the adhesive activator is configured to transmit electromagnetic radiation to the surface of the assembly unit.

11. The object assembly device according to claim 1, wherein at least one voxel has at least one surface configured to reflect at least one of a CMYK color palette.

12. The object assembly device according to claim 1, wherein the assembly unit storage device includes a plurality of removable cartridges.

13. The object assembly device according to claim 12, wherein at least one removable cartridge includes a data storage device accessible by the processor and containing an instruction set for assembling at least one object, and data indicating the number of assembly units necessary to assemble the at least one object according to the instruction set, the assembly units arranged in the cartridge in an order corresponding to their use in assembling the object.

14. The object assembly device according to claim 12, wherein the assembly units are stored on a storage strip located within the removable cartridge.

15. The object assembly device according to claim 14, wherein the storage strip is wound on a spool located within the removable cartridge.

16. The object assembly device according to claim 1, wherein the processor includes a data connection to a network in order to access at least one object assembly instruction set from a remote storage location.

* * * * *